US012660420B2

(12) United States Patent
Park et al.

(10) Patent No.: US 12,660,420 B2
(45) Date of Patent: Jun. 16, 2026

(54) DISPLAY PANEL WITH IMPROVED RELIABILITY AND DISPLAY QUALITY AND DISPLAY APPARATUS INCLUDING THE SAME

(71) Applicant: Samsung Display Co., Ltd., Yongin-Si (KR)

(72) Inventors: Beomsoo Park, Yongin-si (KR); Youngmin Kwon, Yongin-si (KR); Jiryun Park, Yongin-si (KR); Seongjun Lee, Yongin-si (KR); Wangjo Lee, Yongin-si (KR); Jinwhan Jung, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 392 days.

(21) Appl. No.: 18/207,688

(22) Filed: Jun. 9, 2023

(65) Prior Publication Data

US 2024/0224590 A1    Jul. 4, 2024

(30) Foreign Application Priority Data

Jan. 3, 2023    (KR) ......................... 10-2023-0000904

(51) Int. Cl.
*H10K 59/12*    (2023.01)
*G09G 3/3266*    (2016.01)
*H10K 59/121*    (2023.01)
*H10K 59/131*    (2023.01)
*H10K 102/00*    (2023.01)

(52) U.S. Cl.
CPC ....... *H10K 59/1213* (2023.02); *G09G 3/3266* (2013.01); *H10K 59/131* (2023.02); *G09G 2380/02* (2013.01); *H10K 2102/311* (2023.02)

(58) Field of Classification Search
CPC ............. H10K 59/1213; H10K 59/131; H10K 2102/311; G09G 3/3266; G09G 2380/02
USPC ........................................................ 257/40
See application file for complete search history.

(56) References Cited

U.S. PATENT DOCUMENTS

| | | | |
|---|---|---|---|
| 8,508,438 B2 | 8/2013 | Suh | |
| 9,040,990 B2 | 5/2015 | Jo et al. | |
| 10,303,018 B2 | 5/2019 | Song et al. | |
| 11,009,762 B1 | 5/2021 | Hou et al. | |
| | (Continued) | | |

FOREIGN PATENT DOCUMENTS

| | | | | |
|---|---|---|---|---|
| EP | 3462499 A2 * | 4/2019 | ........... | G09G 3/3225 |
| JP | 2019012229 A * | 1/2019 | ....... | G02F 1/133305 |
| | (Continued) | | | |

*Primary Examiner* — Phuc T Dang
(74) *Attorney, Agent, or Firm* — Innovation Counsel LLP

(57) ABSTRACT

Provided is a display panel including a substrate including a first area and a second area disposed on respective sides of a folding line extending in a first direction and a third area protruding from the second area, display devices arranged in a display area of the first area and the second area, pixel circuits arranged in the display area and each comprising a thin-film transistor, data lines connected to the pixel circuits, respectively, and extending in the first direction, scan lines extending in a second direction crossing the first direction, and connection lines arranged on a layer different from the data lines, connecting the data lines to conductive layers arranged in the third area, respectively, and extending from the display area to the third area.

29 Claims, 13 Drawing Sheets

(56) References Cited

U.S. PATENT DOCUMENTS

| | | | |
|---|---|---|---|
| 11,287,850 | B2 | 3/2022 | Chen et al. |
| 2022/0165215 | A1 | 5/2022 | Lee et al. |

FOREIGN PATENT DOCUMENTS

| | | | |
|---|---|---|---|
| KR | 10-1064430 | B1 | 9/2011 |
| KR | 10-1910340 | B1 | 10/2018 |
| KR | 10-1920761 | B1 | 11/2018 |
| KR | 10-2021-0024339 | A | 3/2021 |

* cited by examiner

| Spec. | (Comparative Example 1) | (Comparative Example 2) | (Embodiment) |
|---|---|---|---|
| 1H time | 1.82us | 1.37us | 1.82us |
| Data load Spec. | ≤1.32us | ≤0.87us | ≤1.32us |
| Data load | 0.87us | 1.36us | 1.32us |

1

DISPLAY PANEL WITH IMPROVED RELIABILITY AND DISPLAY QUALITY AND DISPLAY APPARATUS INCLUDING THE SAME

CROSS-REFERENCE TO RELATED APPLICATION

This application is based on and claims priority under 35 U.S.C.s § 119 to Korean Patent Application No. 10-2023-0000904, filed on Jan. 3, 2023, in the Korean Intellectual Property Office, the disclosure of which is incorporated herein in its entirety by reference.

BACKGROUND

1. Field

One or more embodiments relate to a display panel and a display apparatus.

2. Description of the Related Art

As the display field in which various electrical signal information are expressed visually develops rapidly, various flat-panel display apparatuses with excellent characteristics such as thin, light weight, and low power consumption are introduced.

In recent years with the development of display-related technology, bendable display apparatuses or foldable display apparatuses that may be folded and unfolded have been researched and developed.

SUMMARY

One or more embodiments include a display panel and a display apparatus with improved reliability and display quality.

Additional aspects will be set forth in part in the description which follows and, in part, will be apparent from the description, or may be learned by practice of the presented embodiments of the disclosure.

According to one or more embodiments, a display panel may include a substrate including a first area and a second area disposed on respective sides of a folding line extending in a first direction and a third area protruding from the second area, display devices arranged in a display area of the first area and the second area, pixel circuits arranged in the display area and each comprising a thin-film transistor, data lines connected to the pixel circuit, respectively, and extending in the first direction, scan lines extending in a second direction crossing the first direction, and connection lines arranged on a layer different from the data lines, connecting the data lines to conductive layers arranged in the third area, respectively, and extending from the display area to the third area.

According to one or more embodiments, the third area may protrude from the second area in the first direction and a width of the third area in the second direction may be less than or equal to a width of the second area in the second direction.

According to one or more embodiments, the display panel may further include a first scan driver arranged in a peripheral area of the first area, and a second scan driver arranged in a peripheral area of the second area, wherein the first scan driver and the second scan driver are symmetrically arranged with respect to the folding line.

According to one or more embodiments, each of the connection line may include a first portion extending in the first direction and a second portion extending in the second direction.

According to one or more embodiments, an interval between the adjacent connection lines may be less than an interval between the adjacent data lines.

According to one or more embodiments, the connection lines may be arranged between the substrate and a semiconductor layer of the thin-film transistor.

According to one or more embodiments, the display panel may further include a first planarization layer and a second planarization layer arranged between the display diode and the thin-film transistor, wherein the data lines are arranged between the first planarization layer and the second planarization layer.

According to one or more embodiments, the display panel may further include a first planarization layer, a second planarization layer, and a third planarization layer arranged between the display diode and the thin-film transistor, wherein the data lines may be arranged between the first planarization layer and the second planarization layer, and the connection lines may be arranged between the second planarization layer and the third planarization layer.

According to one or more embodiments, each of the conductive layers may be a terminal to which an integrated circuit device is connected.

According to one or more embodiments, the connection lines may be inclined at certain angles with respect to the first direction in the display area.

According to one or more embodiments, a display apparatus may include a display panel and a housing in which the display panel is accommodated, wherein the display panel may include a substrate comprising a first area and a second area disposed on respective sides of a folding line extending in a first direction and a third area protruding from the second area in the first direction, display devices arranged in a display area of the first area and the second area, pixel circuits arranged in the display area and each comprising a thin-film transistor, data lines connected to the pixel circuits, respectively, and extending in the first direction, scan lines extending in a second direction crossing the first direction, and connection lines arranged on a layer different from the data lines, connecting the data lines to conductive layers arranged in the third area, respectively, and extending from the display area to the third area.

According to one or more embodiments, at least a portion of the third area may be bent and at least a portion of the third area is arranged in a lower portion of the second area to overlap the second area.

According to one or more embodiments, the display apparatus may further include an integrated circuit device connected to the conductive layer.

According to one or more embodiments, each of the connection line may include a first portion extending in the first direction and a second portion extending in the second direction.

According to one or more embodiments, an interval between the adjacent connection lines may be less than an interval between the adjacent data lines.

According to one or more embodiments, the connection lines may be disposed between the substrate and a semiconductor layer of the thin-film transistor.

According to one or more embodiments, the display apparatus may further include a first planarization layer and a second planarization layer arranged between the display device and the thin-film transistor, wherein the data lines are arranged between the first planarization layer and the second planarization layer.

According to one or more embodiments, the display apparatus may further include a first planarization layer, a second planarization layer, and a third planarization layer arranged between the display device and the thin-film transistor, wherein the data lines may be disposed between the first planarization layer and the second planarization layer, and the connection lines may be disposed between the second planarization layer and the third planarization layer.

According to one or more embodiments, the connection lines may be inclined at certain angles with respect to the first direction in the display area.

According to one or more embodiments, the connection lines are respectively connected to the data lines through contact holes which are disposed on a line extending along the second direction.

According to one or more embodiments, a display panel may include a substrate including a first area and a second area disposed on respective sides of a folding line extending in a first direction and a third area protruding from the second area, data lines extending in the first direction, and connection lines arranged on a layer different from the data lines, connecting the data lines to conductive layers arranged in the third area, respectively, and extending from the display area to the third area.

According to one or more embodiments, the third area may protrude from the second area along the first direction.

According to one or more embodiments, the connection lines may include first portions extending in a second direction crossing the first direction.

According to one or more embodiments, the second direction may be perpendicular to the first direction.

According to one or more embodiments, a length of a first portion disposed close to the first area may be shorter than that disposed away from the first area.

According to one or more embodiments, the second direction may include a plurality of second directions which are different from each other and extend obliquely to the first direction.

According to one or more embodiments, the third area may protrude from the second area along the second direction.

According to one or more embodiments, the connection lines may include first portions extending in the second direction and second portions extending in a direction crossing the first direction.

According to one or more embodiments, the second portions may extend obliquely to the second direction.

According to one or more embodiments, an angle formed between the second direction and a second portion connected to a data line disposed close to the third area may be greater than that connected to a data line disposed away from the third area.

BRIEF DESCRIPTION OF THE DRAWINGS

The above and other aspects, features, and advantages of certain embodiments of the disclosure will be more apparent from the following description taken in conjunction with the accompanying drawings, in which:

FIG. 7 is a schematic cross-sectional view of a display panel according to an embodiment.

FIG. 12 is a table showing measurements of one horizontal scanning period 1H and data load time at 240 Hz of embodiments and comparative examples of the disclosure.

DETAILED DESCRIPTION

Figure 1A:
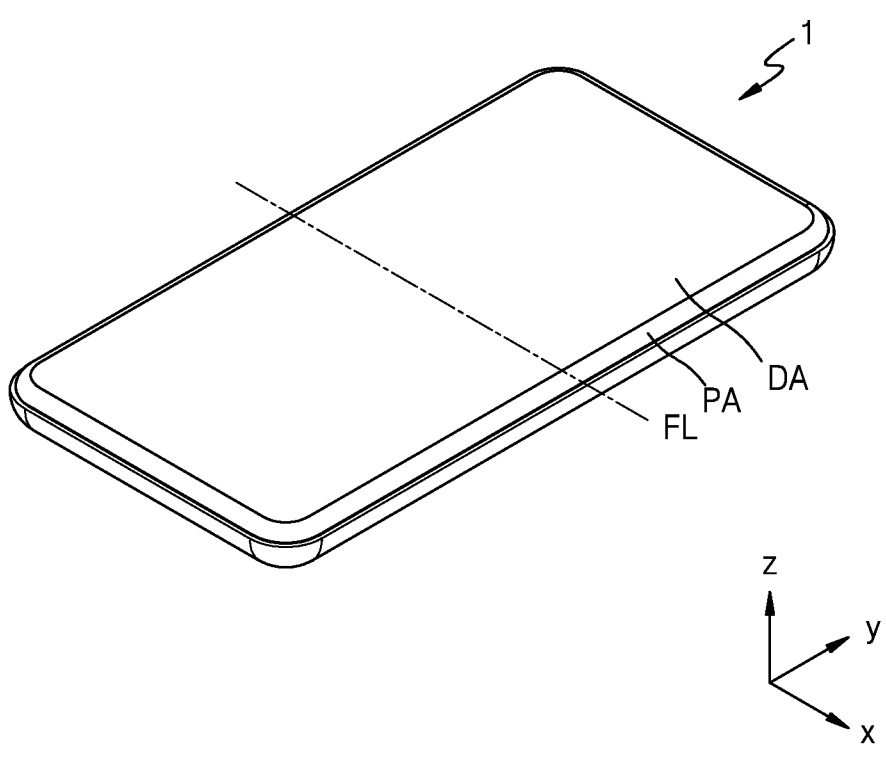
FIGS. 1A and 1B are perspective views schematically illustrating a display apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

The disclosure may include various embodiments and modifications, and certain embodiments thereof are illustrated in the drawings and will be described herein in detail. The effects and features of the disclosure and the accomplishing methods thereof will become apparent from the embodiments described below in detail with reference to the accompanying drawings. However, the disclosure is not limited to the embodiments described below and may be embodied in various modes.

Hereinafter, embodiments will be described in detail with reference to the accompanying drawings, and in the following description, like reference numerals will denote like elements and redundant descriptions thereof will be omitted for conciseness.

It will be understood that although terms such as "first" and "second" may be used herein to describe various elements, these elements should not be limited by these terms and these terms are only used to distinguish one element from another element.

As used herein, the singular forms "a," "an," and "the" are intended to include the plural forms as well, unless the context clearly indicates otherwise.

Also, it will be understood that the terms "comprise," "include," and "have" used herein specify the presence of stated features or elements, but do not preclude the presence or addition of one or more other features or elements.

It will be understood that when a layer, region, or element is referred to as being "on" another layer, region, or element, it may be "directly on" the other layer, region, or element or may be "indirectly on" the other layer, region, or element with one or more intervening layers, regions, or elements therebetween.

Sizes of elements in the drawings may be exaggerated for convenience of description. In other words, because the sizes and thicknesses of elements in the drawings are arbitrarily illustrated for convenience of description, the disclosure is not limited thereto.

When a certain embodiment may be implemented differently, a particular process order may be performed differently from the described order. For example, two consecutively described processes may be performed substantially at the same time or may be performed in an order opposite to the described order.

It will be understood that when a layer, region, or component is referred to as being connected to another layer, region, or component, it can be directly or indirectly connected to the other layer, region, or component. That is, for example, intervening layers, regions, or components may be present. For example, when layers, areas, or elements or the like are referred to as being "electrically connected," they may be directly electrically connected, or layers, areas or elements may be indirectly electrically connected, and an intervening layer, region, component, or the like may be present therebetween.

"A and/or B" is used herein to select only A, select only B, or select both A and B. Throughout the disclosure, the expression "at least one of A and B" indicates only A, only B, or both A and B.

Figure 1B:
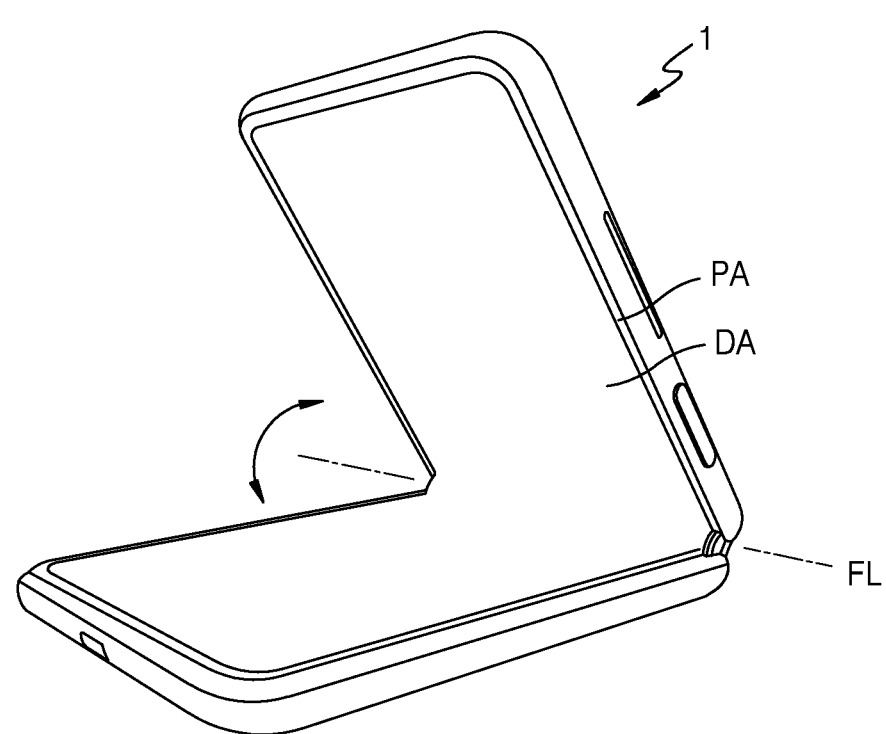

FIGS. 1A and 1B are perspective views schematically illustrating a display apparatus according to an embodiment.

Referring to FIGS. 1A and 1B, the display apparatus 1 is a device that displays a moving image or a still image, and examples thereof may include portable electronic devices such as a mobile phone, a smart phone, a tablet personal computer (PC), a mobile communication terminal, an electronic notebook, an e-book, a portable multimedia player (PMP), a navigation system, and an ultra-mobile PC (UMPC). The display apparatus 1 may also be used as a display screen of various products such as a television, a laptop, a monitor, a billboard, and the Internet of things (IoT). In addition, the display apparatus 1 according to an embodiment may be used in wearable devices, such as smart watches, watch phones, glasses-type displays, and head-mounted displays (HMDs). In addition, the display apparatus 1 according to an embodiment may be used as instrument panels for automobiles, center information displays (CIDs) arranged on center fascias or dashboards, room mirror displays that replace side mirrors of automobiles, and displays arranged on the rear side of front seats as entertainment for passengers in rear seats of automobiles. FIGS. 1A and 1B show that the display apparatus 1 according to an embodiment is used as a smart phone or a laptop for convenience of description.

The display apparatus 1 may have a rectangular shape in a plan view. For example, the display apparatus 1 may have a planar shape of a rectangle having a short side in an x direction and a long side in a y direction. A corner at which the short side in the x direction and the long side in the y direction meet each other may be rounded to have a certain curvature or may be right-angled. A planar shape of the display apparatus 1 is not limited to a rectangle and may have polygonal, an oval, or an atypical shape.

The display apparatus 1 may include a display area DA providing an image using light emitted from pixels and a peripheral area PA disposed on the outside of the display area DA. The display apparatus 1 may be portable in a bar type as shown in FIG. 1A, but may also be portable in a foldable type as shown in FIG. 1B. For example, the display apparatus 1 may be folded with respect to a folding line FL crossing the display area DA in the x direction as shown in FIG. 1B.

Figure 2:
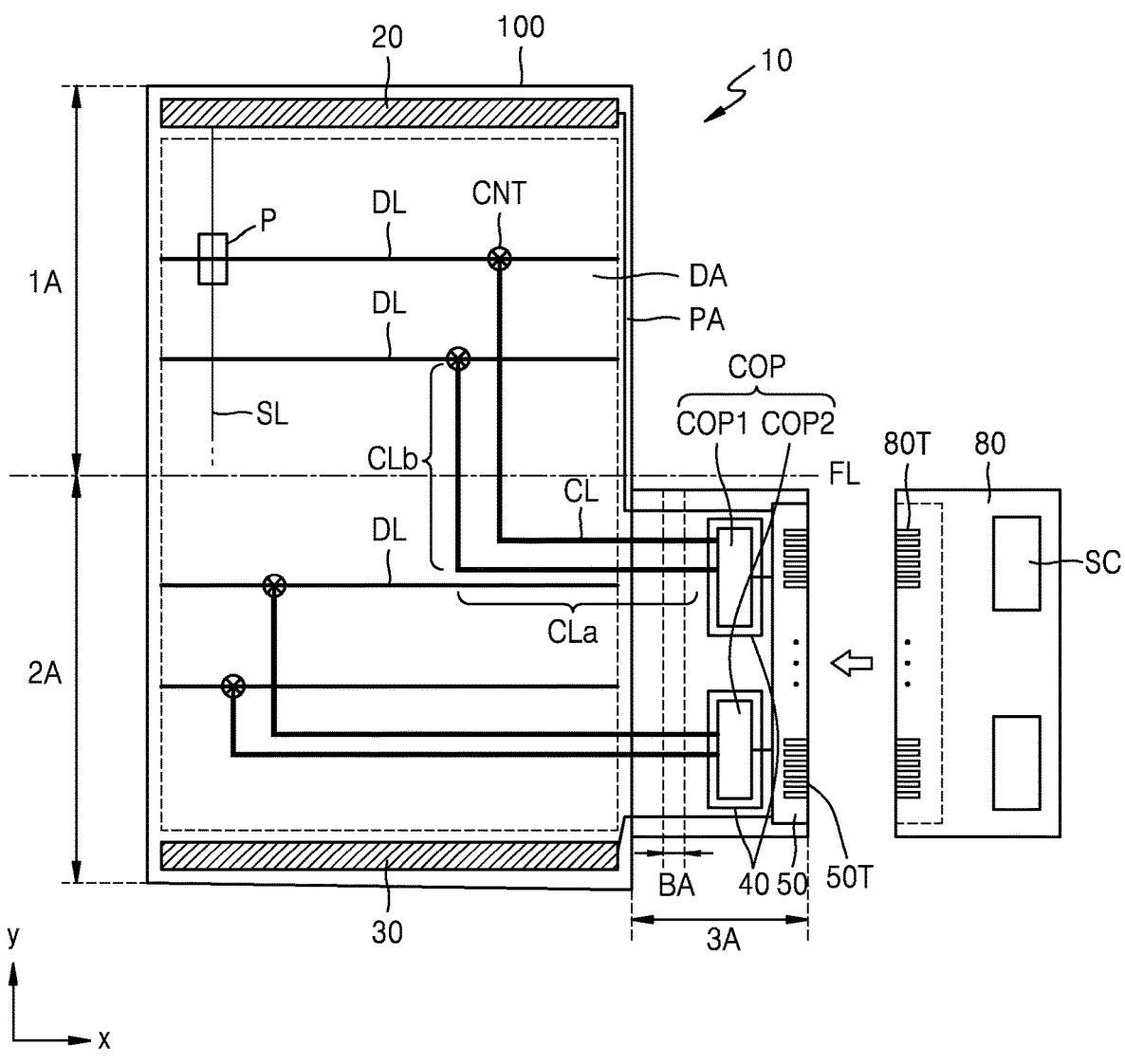
FIG. 2 is a plan view briefly illustrating a display panel according to an embodiment.
Figure 3:
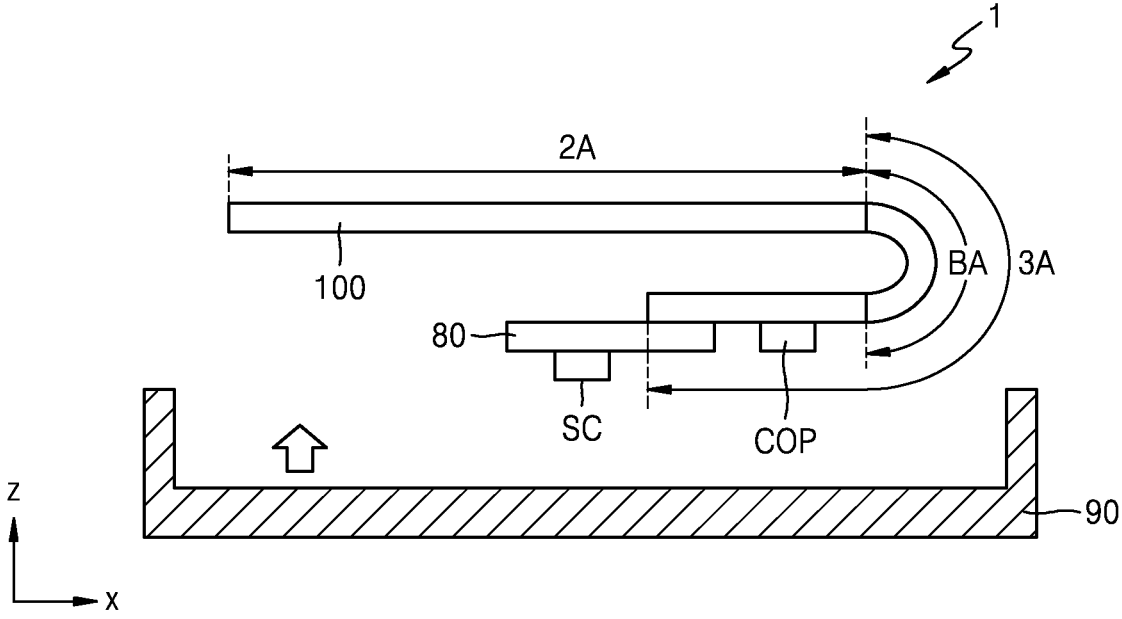
FIG. 3 is a view illustrating a portion of a display panel in a bent state, according to an embodiment.

FIG. 2 is a plan view briefly illustrating a display panel according to an embodiment. FIG. 3 is a diagram briefly illustrating the shape in which a portion of the display panel is bent.

Referring to FIG. 2, a substrate 100 of the display panel 10 may include a first area 1A and a second area 2A that are disposed on respective sides of the folding line FL, and a third area 3A protruding from the second area 2A.

The first area 1A and the second area 2A may overlap each other when folded with respect to the folding line FL. The first area 1A and the second area 2A may be provided in substantially the same size and/or shape. For example, the first area 1A and the second area 2A may be provided in a rectangular shape. The folding line FL may extend in the x direction (a first direction) to bisect the display area DA. The third area 3A may be an area protruding from the second area 2A in the x direction (the first direction). A width of the third area 3A in a second direction (y direction) may be equal to or less than a width of the second area 2A in the second direction (y direction). The third area 3A may be arranged not to overlap the folding line FL.

The display area DA and the peripheral area PA surrounding the display area DA may be arranged in the first area 1A and the second area 2A. The display area DA may not be arranged in the third area 3A and only the peripheral area PA may be arranged in the third area 3A.

Pixels P disposed in the display area DA may emit red, green, and blue light using the light-emitting diode arranged in positions corresponding to each pixel P. Transistors that are electrically connected to the light-emitting diodes and signal lines that are electrically connected to a storage capacitor, for example, data lines DL and scan lines SL, may be arranged in the display area DA. In the present embodiment, the data lines DL may extend along the x direction in the display area DA, and the scan lines SL may extend along the y direction in the display area DA. In this case, the length of the data lines DL may be shorter than the length of the scan lines SL.

In the present embodiment, a side of the display area DA in the x direction may be shorter than a side of the display area DA in the y direction. In this case, when the scan line SL is arranged to extend in the x direction, the number of the scan lines SL may be increased and one horizontal scanning period 1H may be reduced, thereby adversely affecting high frequency driving. In addition, when the data line DL is arranged to extend in the y direction, the increased length of the data line DL may increase resistance and parasitic capacitance, thereby adversely affecting high frequency driving.

The display panel 10 according to the present embodiment may operate advantageously for high-frequency driving by arranging the data lines DL to extend in the x direction corresponding to a short side of the display area DA, and arranging the scan lines SL to extend in the y direction corresponding to a long side of the display area DA.

In addition, in the present embodiment, the width in the y direction of the third area 3A in which an integrated circuit device COP is arranged may be equal to or smaller than half the width in the y direction of the display panel 10. Accordingly, when the display panel 10 is folded along the folding line FL, the display panel 10 may be easily folded because the third area 3A is not folded.

A first scan driver 20 and a second scan driver 30 may be arranged in the peripheral area PA. The first scan driver 20 may be arranged in the peripheral area PA adjacent to the first area 1A and the second scan driver 30 may be arranged in the peripheral area PA adjacent to the second area 2A. When the display panel 10 is in an unfolded state, in a plan view, the first scan driver 20 may be disposed at the top of the display area DA and the second scan driver 30 may be disposed at the bottom of the display panel 10. The first scan driver 20 and the second scan driver 30 may be symmetrically arranged with respect to the folding line FL.

The first and second scan drivers 20 and 30 may be electrically connected to the scan lines SL. In an embodiment, some of the scan lines SL may be electrically connected to the first scan driver 20 and the others may be connected to the second scan driver 30. The first and second scan drivers 20 and 30 may generate a scan signal, and the generated scan signal may be transmitted to a transistor electrically connected to the light-emitting diode through the scan line SL.

Although it is not shown, a driving voltage supply line and a common voltage supply line may be arranged in the peripheral area PA. The driving voltage supply line and the common voltage supply line may supply a driving voltage and a common voltage to a pixel circuit and/or the light-emitting diode arranged in the display area DA.

The integrated circuit device COP may be arranged in the peripheral area PA arranged in the third area 3A. The integrated circuit device COP may be mounted on a first terminal unit 40 to overlap the first terminal unit 40. The first terminal unit 40 may include a plurality of terminals. The integrated circuit device COP may include a data driver. In the specification, the integrated circuit device COP may refer to a data driver. The integrated circuit device COP may be electrically connected to a second terminal unit 50 disposed on opposite side of the display area DA with respect to the integrated circuit device COP. A data signal generated by the integrated circuit device COP, for example, the data driver, may be transmitted to the data line DL through a connection line CL that is electrically connected to the integrated circuit device COP. That is, the connection line CL may be connected to the first terminal unit 40 to which the integrated circuit device COP is connected and may transmit a signal generated by the integrated circuit device COP to the data line DL. The integrated circuit device COP may include a first integrated circuit device COP1 and a second integrated circuit device COP2.

The first integrated circuit device COP1 may transmit data signals to pixel circuits arranged in the first area 1A and the second integrated circuit device COP2 may transmit data signals to pixel circuits arranged in the second area 2A.

The connection line CL may be arranged in a layer different from the data line DL and may be connected to the data line DL through a contact hole CNT. A portion of the connection line CL may be arranged in the display area DA. The contact hole CNT connecting the connection line CL and the data line DL may be arranged in the display area DA. In some embodiments, the connection line CL may include a first portion CLa extending in the x direction and a second portion CLb extending in a second direction. The second direction may include a plurality of second directions which are different from each other and extend obliquely to the first direction. The first portions CLa of the connection lines CL may be arranged in the second area 2A. A length of the first portion disposed close to the first area is shorter than that disposed away from the first area.

Loads of the connection lines CL may be substantially the same. For example, resistance of each of the connection lines may be same. To this end, a width and a length of the connection lines CL may be adjusted. In some embodiments, the width and the length of the connection lines CL may be substantially the same. Accordingly, the contact holes CNTs in which the connection lines CL and the data lines DL are connected may not be arranged in a line in the x direction or the y direction, and may be inclined at certain angles with respect to the x direction. For example, the first portion of the connection line CLa connected to a pixel disposed away from the integrated circuit device COP may be a shorter than that connected to a pixel disposed close to the integrated circuit device COP, and the second portion of the connection line CLb connected to the pixel disposed away from the integrated circuit device COP may be a longer than that connected to the pixel disposed close to the integrated circuit device COP.

In some embodiments, the interval between adjacent data lines DL may be different from the interval between adjacent connection lines CL. For example, the interval between the adjacent connection lines CL may be less than the interval between the adjacent data lines DL.

The second terminal portion 50 may include second terminals 50T. The second terminals 50T may be exposed without being covered by an insulating layer and may be electrically connected to a controller SC disposed on a flexible printed circuit board 80. The flexible printed circuit board 80 may include counter terminals 80T corresponding to the second terminal unit 50. The counter terminals 80T of the flexible printed circuit board 80 may be electrically connected to the second terminals 50T, respectively. The controller SC may generate a control signal for controlling the first and second scan drivers 20 and 30 and the integrated circuit device COP, and the generated control signal may be transmitted to the first and second scan drivers 20 and 30 and the integrated circuit device COP through the second terminals 50T. In addition, the controller SC may transmit a driving voltage and a common voltage to the driving voltage supply line and the common voltage supply line, respectively, through the second terminals 50T.

FIG. 3 illustrates a state in which a portion of the display panel 10 is bent. For simplification of the drawings, the substrate 100 of the display panel 10 is illustrated in a bent state.

Referring to FIG. 3, the third area 3A of the display panel 10 may be bent in a bending area BA included in the third area 3A. Accordingly, the integrated circuit device COP and the flexible printed circuit board 80 may overlap the second area 2A in a thickness direction (a z direction) of the display panel 10. The display apparatus 1 may include the display panel 10 and a housing 90 in which the display panel 10 is accommodated. The display apparatus 1 may be accommodated in the housing 90 in a state in which the third area 3A of the display panel 10 is bent. The display apparatus 1 may further include a window (not shown) arranged on the top of the display panel 10.

In FIGS. 2 and 3, the third region 3A is illustrated to protrude from the second area 2A in the x direction, but the disclosure is not limited thereto. The third area 3A may protrude from the first area 1A in a −x direction. Alternatively, the third area 3A may protrude in the x direction or the −x direction from the first area 1A, and other various modifications may be made.

Figure 4:
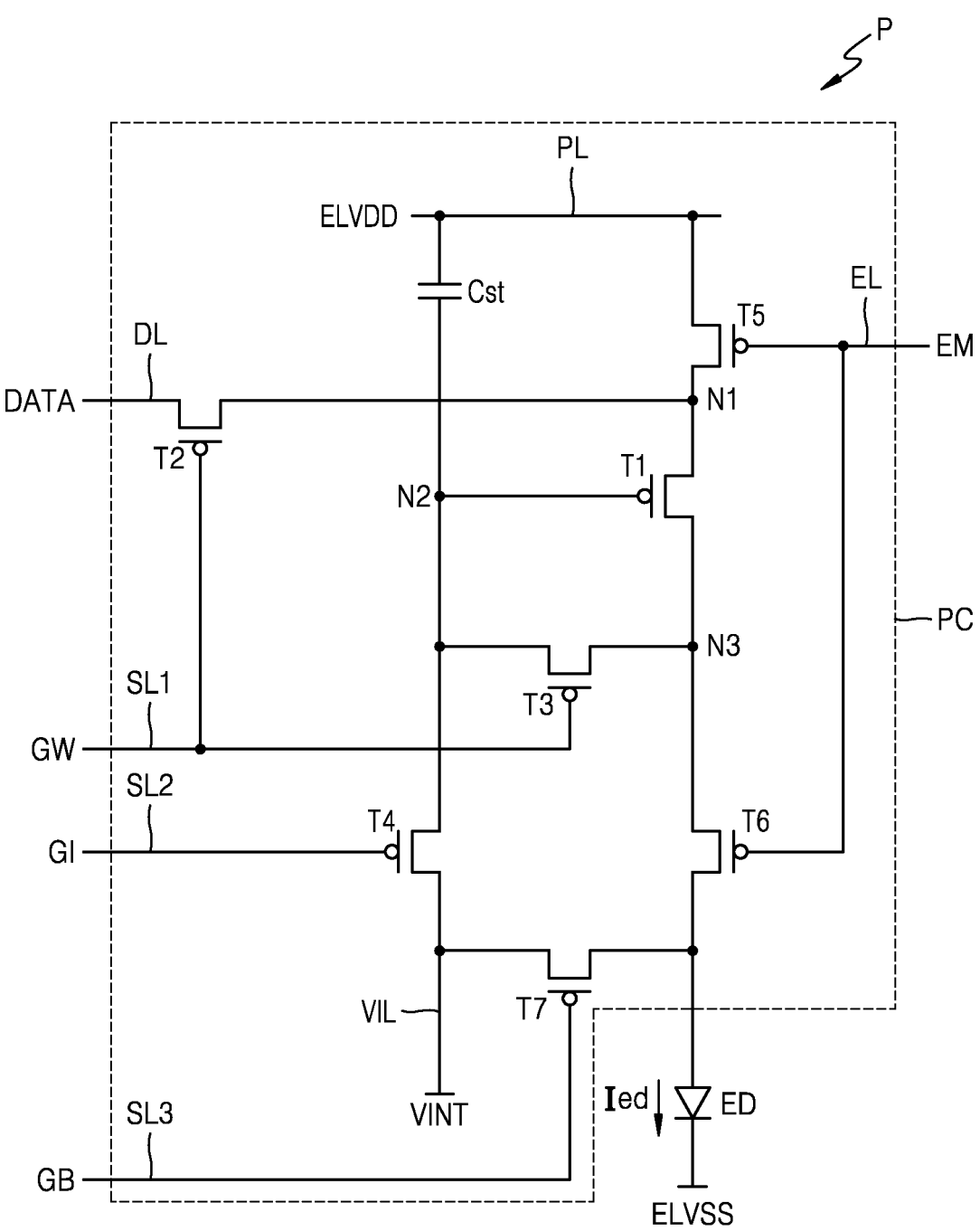
FIG. 4 is an equivalent circuit diagram schematically illustrating a pixel circuit configured to drive the light-emitting diode arranged in the display apparatus.

FIG. 4 is an equivalent circuit diagram schematically illustrating a pixel circuit configured to drive the light-emitting diode arranged in the display panel. As described with reference to FIG. 2, each pixel P may emit light using a light-emitting diode ED. The light-emitting diode ED may be electrically connected to a pixel circuit PC.

Referring to FIG. 4, the pixel circuit PC may include first to seventh transistors T1 to T7. Depending on the type of transistor (N type or P type) and/or the operating condition, a first terminal of the transistor may be a source electrode or a drain electrode, and a second terminal may be an electrode different from the first terminal. For example, when the first terminal is a source terminal, the second terminal may be a drain terminal.

The pixel circuit PC may be connected to a first scan line SL1 configured to transmit a first scan signal GW, a second scan line SL2 configured to transmit a second scan signal GI, a third scan line SL3 configured to transmit a third scan signal GB, an emission control line EL configured to transmit an emission control signal EM, the data line DL configured to transmit a data signal DATA, a driving voltage line PL configured to transmit a driving voltage ELVDD, and an initialization voltage line VIL configured to transmit an initialization voltage VINT. In some embodiments, the second scan line SL2 and the third scan line SL3 may be connected to each other to provide the same signal. That is, in some embodiments, the second scan signal GI and the third scan signal GB may be the same.

The first transistor T1 (a driving thin-film transistor) may be connected between the driving voltage line PL and the light-emitting diode ED. The first transistor T1 may be connected between a first node N1 and a third node N3. The first transistor T1 may be connected to the driving voltage line PL via the fifth transistor T5 and may be electrically connected to the light-emitting diode ED via the sixth transistor T6. The first transistor T1 may include a gate electrode connected to a second node N2, a first electrode connected to the first node N1, and a second electrode connected to the third node N3. The driving voltage line PL may transmit the driving voltage ELVDD to the first transistor T1. The first transistor T1 may function as a driving thin-film transistor and may receive the data signal DATA according to a switching operation of the second transistor T2 to supply a driving current (led) to the light-emitting diode.

The second transistor T2 (a switching thin-film transistor) may be connected between the data line DL and the first node N1. The second transistor T2 may be connected to the driving voltage line PL via the fifth transistor T5. The second transistor T2 may include a gate electrode connected to the first scan line SL1, a first terminal connected to the data line DL, and a second terminal connected to the first node N1. The second transistor T2 may be turned on in response to the first scan signal GW received through the first scan line SL1 to perform a switching operation of transmitting the data signal DATA received through the data line DL to the first node N1.

The third transistor T3 (a reward transistor) may be connected between the second node N2 and the third node N3. The third transistor T3 may be connected to the light-emitting diode ED via the sixth transistor T6. The third transistor T3 may include a gate electrode connected to the first scan line SL1, a first terminal connected to the second node N2, and a second terminal connected to the third node N3. The third transistor T3 may be turned on in response to the first scan signal GW received through the first scan line SL1 to diode-connect the first transistor T1 to compensate for a threshold voltage of the first transistor T1.

The fourth transistor T4 (a first initialization transistor) may be connected between the second node N2 and the initialization voltage line VIL. The fourth transistor T4 may include a gate electrode connected to the second scan line SL2, a first terminal connected to the second node N2, and a second terminal connected to the initialization voltage line VIL. The fourth transistor T4 may be turned on in response to the second scan signal GI received through the second scan line SL2 to transmit the initialization voltage VINT to the gate electrode of the first transistor T1 to Initialize the gate electrode of the first transistor T1.

The fifth transistor T5 (an operation control transistor) may be connected between the driving voltage line PL and the first node N1. The sixth transistor T6 (an emission control transistor) may be connected between the third node N3 and the light-emitting diode ED. The fifth transistor T5 may include a gate electrode connected to the emission control line EL, a first terminal connected to the driving voltage line PL, and a second terminal connected to the first node N1. The sixth transistor T6 may include a gate electrode connected to the emission control line EL, a first terminal connected to the third node N3, and a second terminal connected to a pixel electrode of the light-emitting diode ED. The fifth transistor T5 and the sixth transistor T6 may be simultaneously turned on in response to the emission control signal EM received through the emission control line EL, and thus, a driving current may flow through the light-emitting diode ED.

The seventh transistor T7 (a second initialization transistor) may be connected between the light-emitting diode ED and the initialization voltage line VIL. The seventh transistor T7 may include a gate electrode connected to the third scan line SL3, a first terminal connected to the second terminal of the sixth transistor T6 and the pixel electrode of the light-emitting diode ED, and a second terminal connected to the initialization voltage line VIL. The seventh transistor T7 may be turned on in response to the third scan signal GB received through the third scan line SL3 to transmit the initialization voltage VINT to the pixel electrode of the light-emitting diode ED to initialize the pixel electrode of the light-emitting diode ED.

A capacitor Cst may include a first electrode connected to the second node (the gate electrode of the first transistor T1) and a second electrode connected to the driving voltage line PL. The capacitor Cst may be configured to maintain a voltage applied to the gate electrode of the first transistor T1 by storing and maintaining a voltage corresponding to a difference between the voltages of both ends of the driving voltage line PL and the gate electrode of the first transistor T1.

The light-emitting diode ED may include a pixel electrode (a first electrode, an anode) and a counter electrode (a second electrode, a cathode) to which a common voltage ELVSS may be applied. The light-emitting diode ED receives a driving current from the first transistor T1 to emit light.

FIG. 4 illustrates the pixel circuit PC including seven transistors and one capacitor, but the disclosure is not limited thereto. The pixel circuit PC may include eight or nine transistors or may include two to six transistors. In addition, various pixel circuits PC, for example, a pixel circuit including two capacitors, may be applied.

The light-emitting diode of the present embodiment may be various display devices such as organic light-emitting diodes, inorganic light-emitting diodes, or quantum dot light-emitting diodes.

Figure 5:
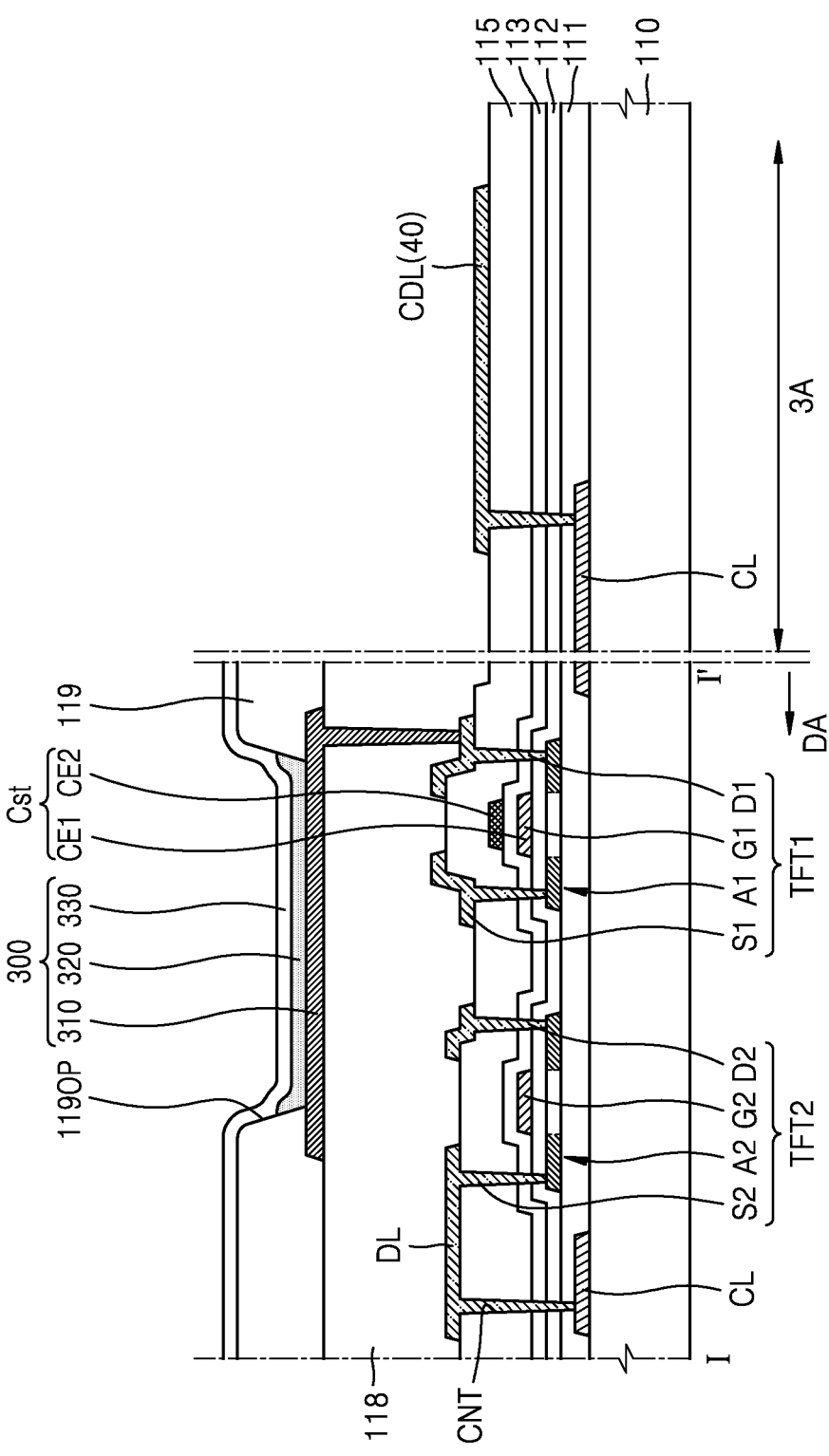
FIG. 5 is a schematic cross-sectional view of a display panel according to an embodiment.

FIG. 5 illustrates a schematic cross-sectional view of a display panel according to an embodiment. Specifically, FIG. 5 illustrates a portion of the display area DA and a portion of the third area 3A of the display panel.

The substrate 100 may be formed of various materials such as glass, metal, or plastic. In an embodiment, the substrate 100 may be a flexible substrate, and may include polymer resin such as polyethersulfone (PES), polyacrylate (PAR), polyetherimide (PEI), polyethylene naphthalate (PEN), polyethyeleneterepthalate (PET), polyphenylene sulfide (PPS), polyallylate, polyimide (PI), polycarbonate (PC), or cellulose acetate propionate (CAP).

The connection line CL may be arranged on the substrate 100. The connection line CL may include molybdenum (Mo), aluminum (Al), copper (Cu), titanium (Ti), or the like and may include a single layer or multiple layers. For example, the connection line CL may have a single-layer structure of Mo. Alternatively, the connection line CL may have a double-layer structure of Ti/Al or a triple-layer structure of Ti/TiN/Al. The thickness of the connection line CL may be from about 3,000 Å to about 4,000 Å. A barrier layer (not shown) that flattens the upper surface of the substrate and blocks the penetration of external substances may further be included between the substrate 100 and the connection line CL.

A buffer layer 111 may cover the connection line CL and may be arranged on the front surface of the substrate 100. The buffer layer 111 may reduce or block penetration of foreign substances, moisture or external air from the lower portion of the substrate 100 and may provide a flat surface to the substrate 100. The buffer layer 111 may include an inorganic material such as oxide or nitride, an organic material, or an organic/inorganic composite and may include a single-layer or multiple-layer structure of an inorganic material and an organic material.

A first thin-film transistor TFT1 may include a semiconductor layer A1, a gate electrode G1, a source electrode S1, and a drain electrode D1, and a second thin-film transistor TFT2 may include a semiconductor layer A2, a gate electrode G2, a source electrode S2, and a drain electrode D2. The first thin-film transistor TFT1 may be connected to an organic light-emitting diode 300 to function as the driving thin-film transistor configured to drive the organic light-emitting diode 300. The second thin-film transistor TFT2 may be connected to the data line DL to function as the switching thin-film transistor. In the drawings, two thin-film transistors are illustrated, but embodiments are not limited thereto. The number of thin-film transistors may be modified. For example, two to seven thin-film transistors may be provided.

A first thin-film transistor TFT1 may include a semiconductor layer A1, a gate electrode G1, a source electrode S1, and a drain electrode D1, and a second thin-film transistor TFT2 may include a semiconductor layer A2, a gate electrode G2, a source electrode S2, and a drain electrode D2. The first thin-film transistor TFT1 may be connected to an organic light-emitting diode 300 to function as the driving thin-film transistor configured to drive the organic light-emitting diode 300. The second thin-film transistor TFT2 may be connected to the data line DL to function as the switching thin-film transistor. In the drawings, two thin-film transistors are illustrated, but embodiments are not limited thereto.

The semiconductor layers A1 and A2 may include amorphous silicon or poly silicon. In some embodiments, the semiconductor layers A1 and A2 may include an oxide of at least one material selected from a group consisting of indium (In), gallium (Ga), stannum (Sn), zirconium (Zr), vanadium (V), hafnium (Hf), cadmium (Cd), germanium (Ge), chromium (Cr), titanium (Ti), cesium (Cs), cerium (Ce), and zinc (Zn). The semiconductor layers A1 and A2 may include a channel area, and a source area and a drain area that are doped with impurities. The semiconductor layers A1 and A2 may include a single layer or multiple layers.

A first gate insulating layer 112 may be cover the semiconductor layers A1 and A2, and include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or the like.

A second gate insulating layer 113 may cover the gate electrodes G1 and G2. A second gate insulating layer 113 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or the like.

A first electrode CE1 of the capacitor Cst may overlap the first thin-film transistor TFT1. For example, the gate electrode G1 of the first thin-film transistor TFT1 may function as the first electrode CE1 of the capacitor Cst.

A second electrode CE2 of the capacitor Cst may overlap the first electrode CE1 with the second gate insulating layer 113 interposed therebetween. In this case, the second gate insulating layer 113 may function as a dielectric layer of the capacitor Cst. The second electrode CE2 may include a conductive material including molybdenum (Mo), aluminum (Al), copper (Cu), and/or titanium (Ti), and may include a single layer or multiple layers including the above material. For example, the second electrode CE2 may include a single layer of Mo or multiple layers of Mo/Al/Mo.

An interlayer insulating layer 115 may be arranged on the front surface of the substrate 100 to cover the second electrode CE2 of the capacitor Cst. The interlayer insulating layer 115 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or the like.

The source electrodes S1 and S2 and the drain electrodes D1 and D2 may be arranged on the interlayer insulating layer 115. The source electrodes S1 and S2 and the drain electrodes D1 and D2 may include a conductive material including molybdenum (Mo), aluminum (Al), copper (Cu), titanium (Ti), etc. and may have a multi-layer or single-layer structure including the material described above. For example, the source electrodes S1 and S2 and the drain electrodes D1 and D2 may have a multi-layer structure of Ti/Al/Ti.

A planarization layer 118 may be arranged on the source electrodes S1 and S2 and the drain electrodes D1 and D2, and the organic light-emitting diode 300 may be located on the planarization layer 118.

The planarization layer 118 may have a flat upper surface so that a pixel electrode 310 may be formed to be flat. The planarization layer 118 may be formed of films of an organic material in a single-layer or multi-layer structure. The planarization layer 118 may include general purpose polymers such as benzocyclobutene (BCB), polyimide, hexamethyldisiloxane (HMDSO), polymethylmethacrylate (PMMA), or polystyrene (PS), polymer derivatives having a phenolic group, acrylic polymers, imide-based polymers, arylether-based polymers, amide-based polymers, fluorine-based polymers, p-xylene-based polymers, vinyl alcohol-based polymers, a blend thereof, and the like. The planarization layer 118 may include an inorganic material. The planarization layer 118 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). If the planarization layer 118 includes an inorganic material, depending on the case, a chemical mechanical polishing may be performed to planarize the inorganic material. The planarization layer 118 may include both organic materials and inorganic materials.

In the display area DA of the substrate 100, an organic light-emitting diode 300 is arranged on the planarization layer 118. The organic light-emitting diode 300 may include the pixel electrode 310, an intermediate layer 320 including an organic emission layer, and a counter electrode 330.

The planarization layer 118 may have an opening exposing any one of the source electrode S1 and the drain electrode D1 of the first thin film transistor TFT1, and the pixel electrode 310 may contact the source electrode S1 or the drain electrode D1 through the opening to be electrically connected to the first thin-film transistor TFT1.

The pixel electrode 310 may be a transparent electrode or a reflective electrode. In some embodiments, the pixel electrode 310 may include a reflective layer including Ag, Mg, Al, Pt, Pd, Au, Ni, Nd, Ir, Cr, a compound thereof, and the like, and a transparent or semi-transparent electrode layer formed on the reflective layer. The transparent or semi-transparent electrode layer may include at least one material selected from the group consisting of an indium tin oxide (ITO), an indium zinc oxide (IZO), a zinc oxide (ZnO), an indium oxide ($In_2O_3$), an indium gallium oxide (IGO), and an aluminum zinc oxide (AZO).

A pixel defining layer 119 may be disposed on the pixel electrode 310, and the pixel defining layer 119 may include an opening 119OP exposing at least a center portion of the pixel electrode 310, thereby defining an emission area of a pixel. In addition, the pixel defining layer 119 may prevent an arc or the like from occurring at the edge of the pixel electrode 310 by increasing a distance between the edge of the pixel electrode 310 and the counter electrode 330 disposed above the pixel electrode 310. The pixel defining layer 119 may include at least one organic insulating material from among polyimide, polyamide, acrylic resin, BCB, and phenolic resin, and may be formed by spin coating or the like.

The intermediate layer 320 of the organic light-emitting diode 300 may include an organic emission layer. The organic emission layer may include an organic material including a fluorescent or phosphorescent material that emits red, green, blue, or white light. The organic emission layer may include a low molecular organic material or a high molecular organic material, and a functional layer such as a hole transport layer (HTL), a hole injection layer (HIL), an electron transport layer (ETL), and an electron injection layer (EIL), may be optionally arranged below and above the organic emission layer. The intermediate layer 320 may be arranged to correspond to each of the plurality of pixel electrodes 310. However, the disclosure is not limited thereto. The intermediate layer 320 may be variously modified to, for example, include a layer integrated across the plurality of pixel electrodes 310.

The counter electrode 330 may be a transmissive electrode or a reflective electrode. In some embodiments, the counter electrode 330 may be a transparent or semi-transparent electrode, and may be formed of a metal thin film having a small work function including Li, Ca, LiF/Ca, LiF/Al, Al, Ag, Mg, and a compound thereof. Furthermore, a transparent conductive oxide (TCO) film of ITO, IZO, ZnO, or $In_2O_3$, and the like may be further arranged on the metal thin film. The counter electrode 330 may be arranged across the display area DA and the peripheral area PA and above the intermediate layer 320 and the pixel defining layer 119. The counter electrode 330 is integrally formed in a plurality of organic light-emitting diodes 300 to correspond to a plurality of pixel electrodes 310.

In the display area DA, the data line DL may be arranged on the interlayer insulating layer 115. The data line DL may be arranged on the same layer as the source electrodes S1 and S2 and the drain electrodes D1 and D2 of the thin-film transistors TFT1 and TFT2. The data line DL may be connected to the connection line CL arranged on another layer via the contact hole CNT. The connection line CL may be arranged between the substrate 100 and the semiconductor layers A1 and A2 of the thin-film transistors TFT1 and TFT2. The connection line CL may be arranged between the substrate 100 and the buffer layer 111. The contact hole CNT may be formed through the interlayer insulating layer 115, the second gate insulating layer 113, the first gate insulating layer 112, and the buffer layer 111.

The connection line CL extending from the display area DA may be arranged in the third area 3A. In the third area 3A, the connection line CL may be connected to a conductive layer CDL which is formed on a layer different from a layer on which the connection line CL is formed. The conductive layer CDL may be arranged on the interlayer insulating layer 115. The conductive layer CDL may be arranged on the same layer as the data line DL. In some embodiments, the conductive layer CDL may be a portion of the first terminal unit 40 on which the integrated circuit device COP (refer to FIG. 2) is mounted.

Figure 6:
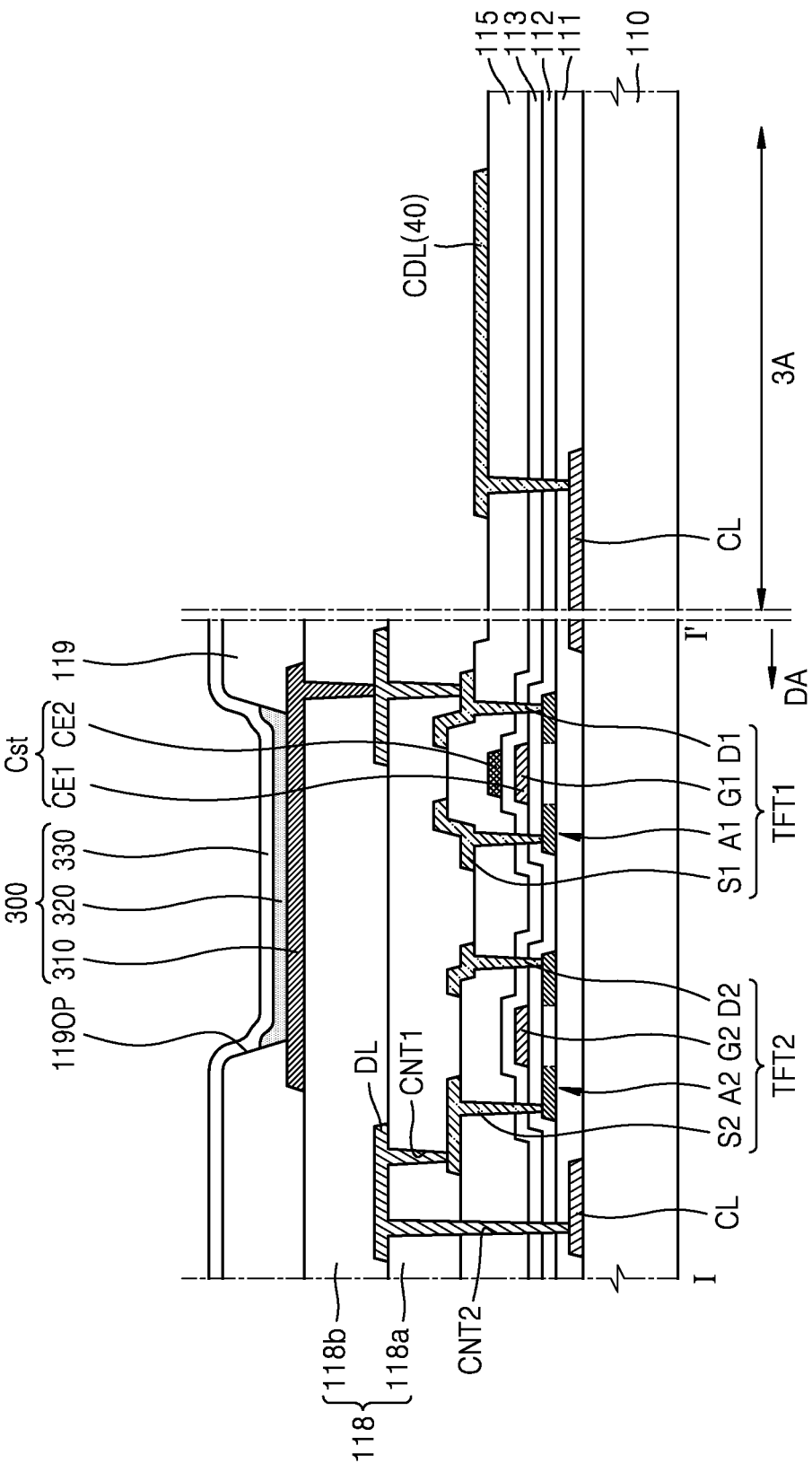
FIG. 6 is a schematic cross-sectional view of a display panel according to an embodiment.

FIG. 6 is a schematic cross-sectional view of a display panel according to an embodiment. In FIG. 6, the same symbols as those of FIG. 5 denote the same members, and redundant descriptions thereof will be omitted.

Referring to FIG. 6, the planarization layer 118 covering the thin-film transistors TFT1 and TFT2 in the display area DA may include stacked layers of a first planarization layer 118a and a second planarization layer 118b. The first planarization layer 118a and the second planarization layer 118b may include the same material or different materials from each other.

In the present embodiment, the data line DL may be arranged between the first planarization layer 118a and the second planarization layer 118b. A circuit integration degree may be improved as the data line DL is arranged on the first planarization layer 118a. The data line DL may be arranged on the source electrode S2 of the second thin-film transistor TFT2. The data line DL may be connected to the source electrode S2 via a contact hole CNT1 formed through the first planarization layer 118a. In addition, the data line DL may be connected to the connection line CL arranged below the data line DL via the contact hole CNT2. The contact hole CNT2 may be formed through the first planarization layer 118a, the interlayer insulating layer 115, the second gate insulating layer 113, the first gate insulating layer 112, and the buffer layer 111.

As the data line DL is arranged on the first planarization layer 118a, the data line DL may be arranged on a layer different from the conductive layer CDL arranged in the third area 3A.

Figure 7:
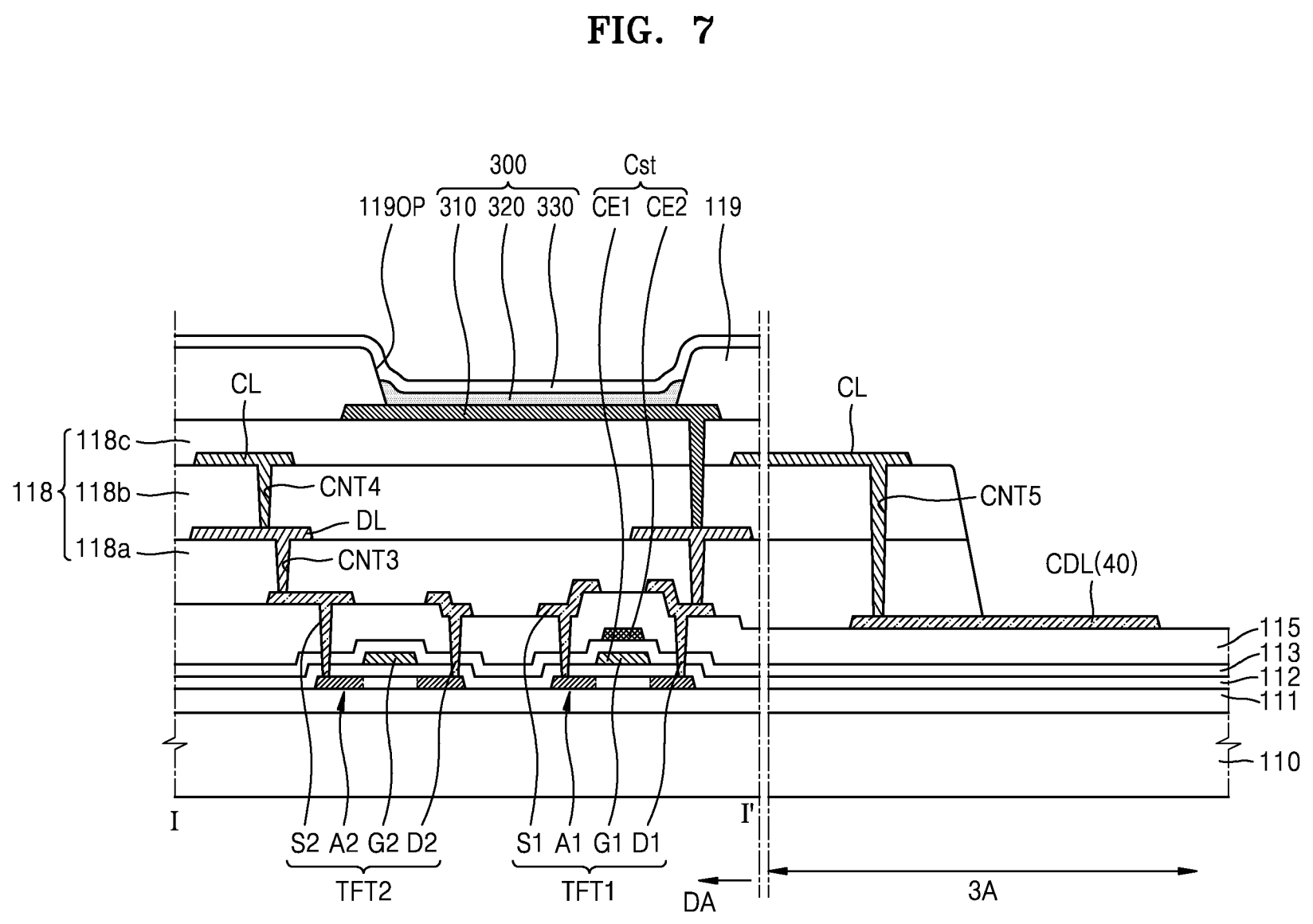

FIG. 7 is a schematic cross-sectional view of a display panel according to an embodiment. In FIG. 7, the same symbols as those of FIG. 5 denote the same members, and redundant descriptions thereof will be omitted.

Referring to FIG. 7, the planarization layer 118 may include stacked layers of the first planarization layer 118a, the second planarization layer 118b, and a third planarization layer 118c. The first planarization layer 118a, the second planarization layer 118*b*, and the third planarization layer 118*c* may include the same material or different materials from each other.

In the present embodiment, the data line DL may be arranged between the first planarization layer 118*a* and the second planarization layer 118*b*. A circuit integration degree may be improved as the data line DL is arranged on the first planarization layer 118*a*. The data line DL may be arranged on the source electrode S2 of the second thin-film transistor TFT2. The data line DL may be connected to the source electrode S2 via the contact hole CNT3 formed through the first planarization layer 118*a*.

In addition, in the present embodiment, the connection line CL may be arranged farther from the substrate 100 than the data line DL. The connection line CL may be arranged on the second planarization layer 118*b*. The connection line CL may be connected to the data line DL via the contact hole CNT4 formed through the second planarization layer 118*b*.

In the third area 3*a*, the connection line CL may be connected to the conductive layer CDL formed on the interlayer insulating layer 115 through a contact hole CNT5 formed through the second planarization layer 118*b* and the first planarization layer 118*a*.

Figure 8:
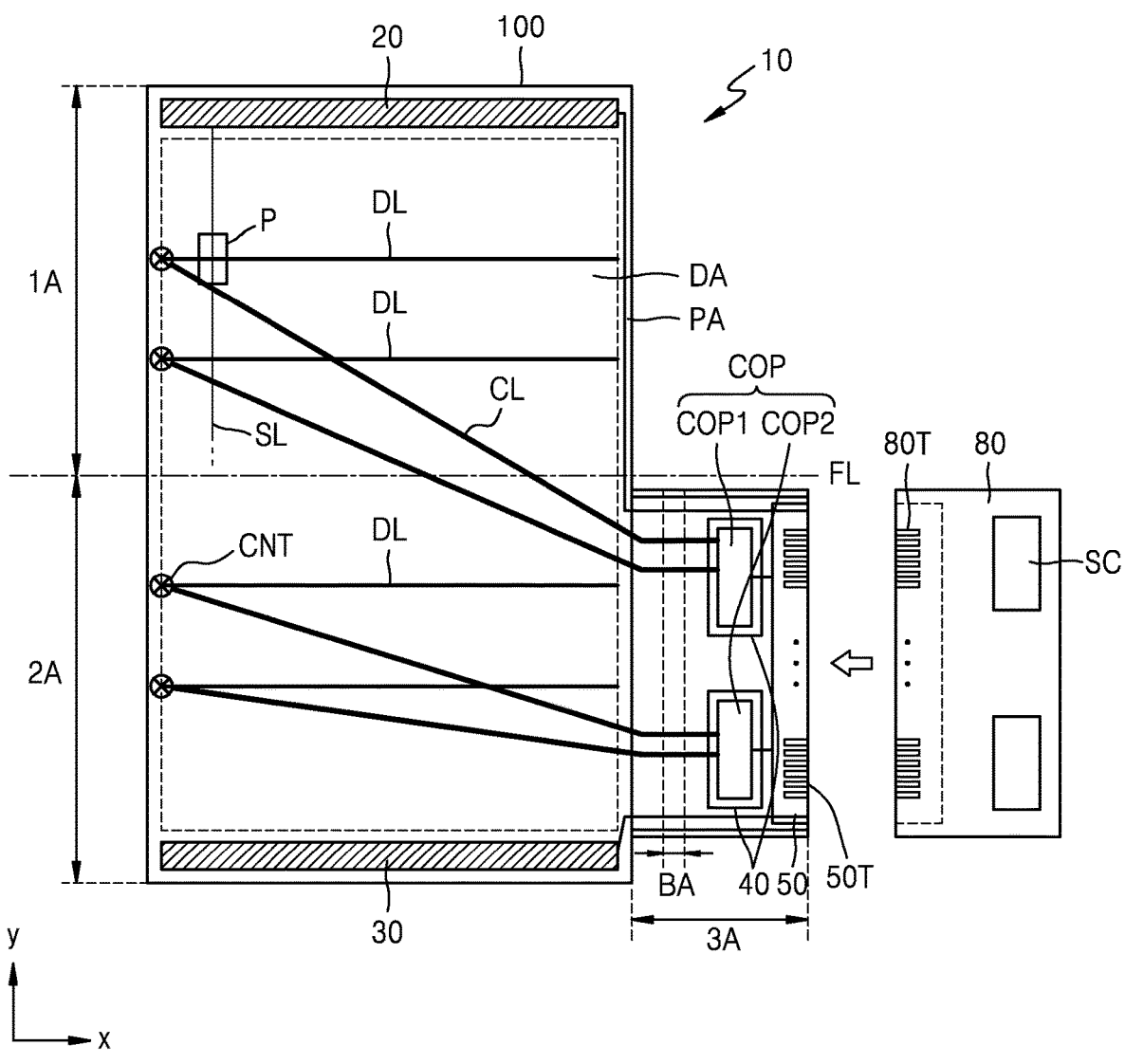
FIGS. 8, 9, 10 and 11 are plan views briefly illustrating a display panel according to an embodiment.

FIG. 8 is a plan view briefly illustrating a display panel according to an embodiment. In FIG. 8, the same symbols as those of FIG. 2 denote the same members.

Referring to FIG. 8, the substrate 100 of the display panel 10 may include the first area 1A and the second area 2A that are disposed on respective sides of the folding line FL, and the third area 3A protruding from the second area 2A.

A width of the third area 3A in a second direction (y direction) may be equal to or less than a width of the second area 2A in the second direction (y direction). The third area 3A may be arranged not to overlap the folding line FL. The third area 3*a* may be bent in the bending area BA.

The display area DA and the peripheral area PA surrounding the display area DA may be arranged in the first area 1A and the second area 2A. The display area DA may not be arranged in the third area 3A and only the peripheral area PA may be arranged in the third area 3A.

The pixels P disposed in the display area DA may emit red, green, and blue light by using the light-emitting diode arranged in positions corresponding to each pixel P. Transistors that are electrically connected to the light-emitting diodes and signal lines, such as data lines DL and scan lines SL, may be arranged in the display area DA. In the present embodiment, the data lines DL may extend along the x direction in the display area DA, and the scan lines SL may extend along the y direction in the display area DA.

The data lines DL may be connected to the integrated circuit device COP arranged in the third area 3A via the connection lines CL. The connection line CL may be arranged in a layer different from the data line DL and may be connected to the data line DL through a contact hole CNT. A portion of the connection line CL may be arranged in the display area DA. The contact hole CNT connecting the connection line CL and the data line DL may be arranged in the display area DA.

In the present embodiment, the contact holes CNT connecting the connection lines CL and the data lines DL may be arranged in a line extending along the y direction. For example, the contact holes CNT may be arranged along one side of the display area DA disposed on the opposite side of the third area 3A with respect to the display area DA. In this case, the connection lines CL may not extend in the x direction and the y direction and may extend in an inclined state by a certain angle with respect to the x direction. In addition, the widths of the connection lines CL may be provided differently from each other such that the loads of the connection lines are matched. For example, the width of a long connection line CL may be greater than that of a short connection line CL.

In the drawings, the connection lines CL are illustrated to extend in a straight line, but the disclosure is not limited thereto. The connection lines CL may be provided in various shapes such as curves and stair shapes.

Figure 9:
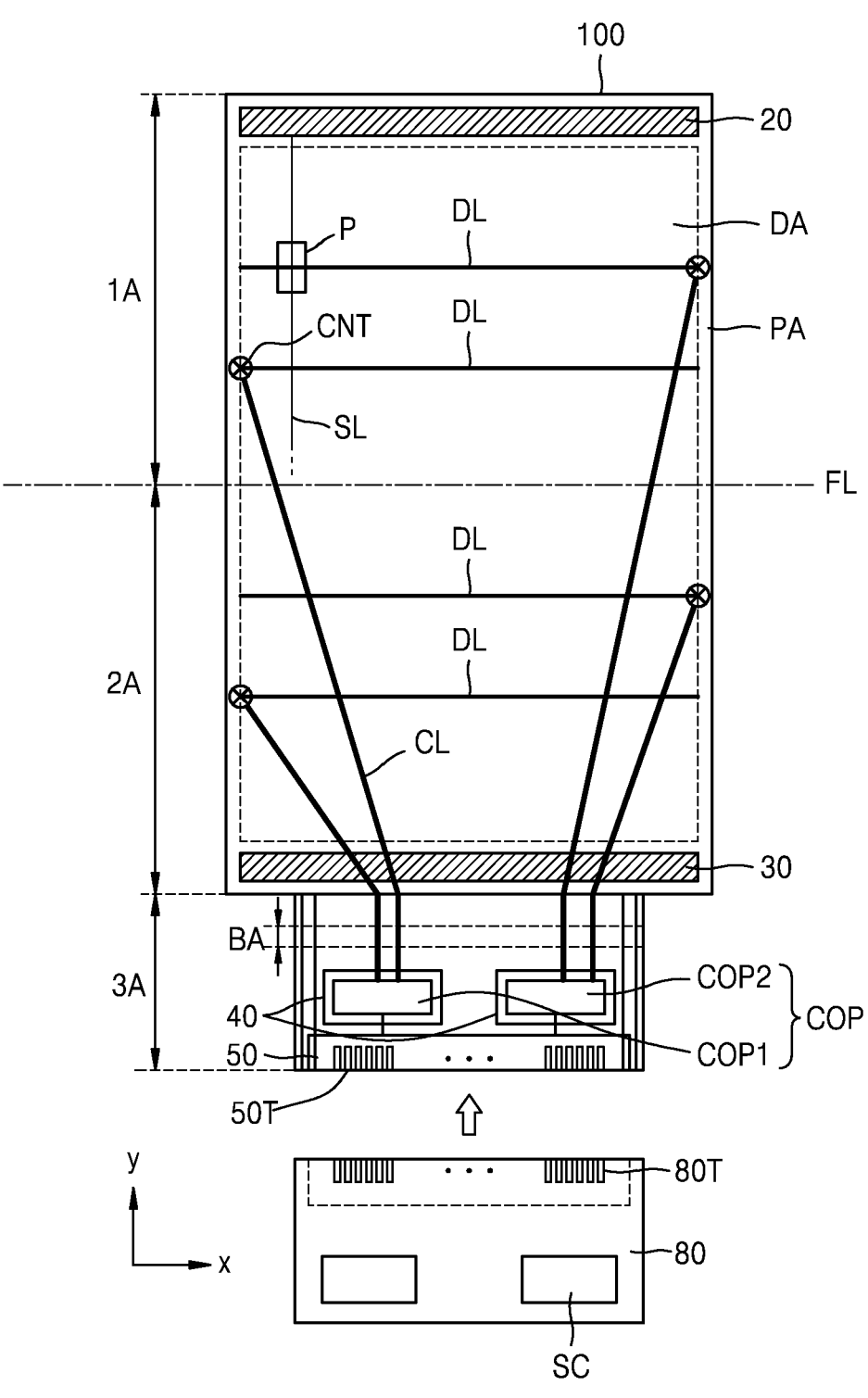
Figure 10:
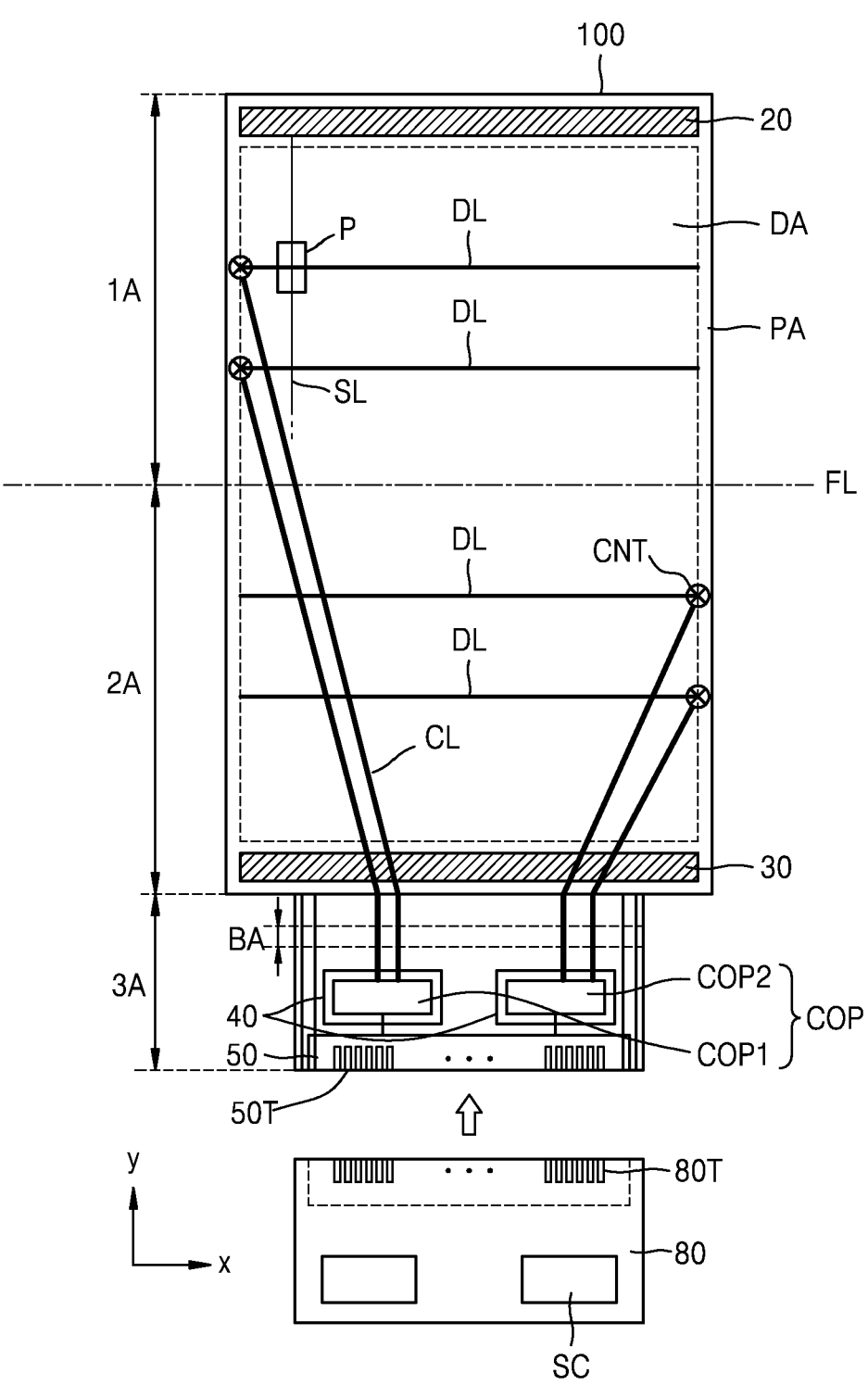
Figure 11:
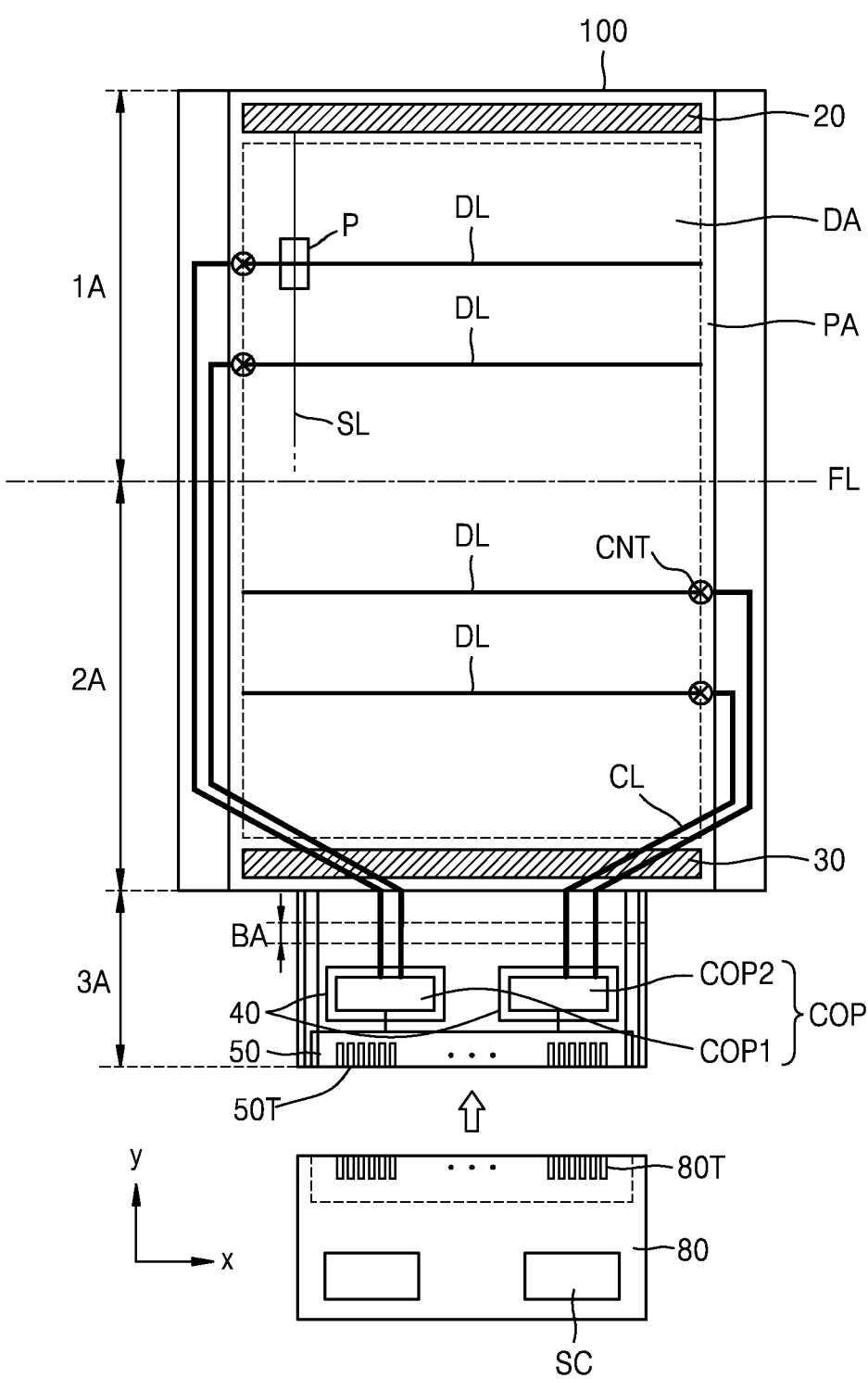

FIGS. 9 to 11 are plan views briefly illustrating a display panel according to embodiments. In FIGS. 9 to 11, the same symbols as those of FIG. 2 denote the same member.

Referring to FIGS. 9 to 11, the substrate 100 of the display panel 10 may include the first area 1A and the second area 2A that are disposed on respective sides of the folding line FL, and the third area 3A protruding from the second area 2A in the y direction.

In the present embodiment, the third area 3A may be an area protruding in a −y direction from the second area 2A. The integrated circuit device COP may be arranged in the third area 3A. The third area 3A may be bent in the bending area BA.

The display area DA and the peripheral area PA surrounding the display area DA may be arranged in the first area 1A and the second area 2A. The display area DA may not be arranged in the third area 3A and only the peripheral area PA may be arranged in the third area 3A. A side of the display area DA in the x direction may be shorter than a side of the display area DA in the y direction.

The pixels P placed in the display area DA may emit red, green, and blue light using the light-emitting diode arranged in positions corresponding to each pixel P. The transistors that are electrically connected to the light-emitting diodes and the signal lines that are electrically connected to the storage capacitor, for example, the data lines DL and the scan lines SL, may be arranged in the display area DA. In the present embodiment, the data lines DL may extend along the short side of the display area DA in the x direction, and the scan lines SL may extend along the long side of the display area DA in the y direction.

The data lines DL may be connected to the integrated circuit device COP arranged in the third area 3A via the connection lines CL. The connection line CL may be arranged in a layer different from the data line DL and may be connected to the data line DL through a contact hole CNT. A portion of the connection line CL may be arranged in the display area DA. The contact hole CNT connecting the connection line CL and the data line DL may be arranged in an edge of the display area DA.

The integrated circuit device COP may include a first integrated circuit device COP1 and a second integrated circuit device COP2. Some of the plurality of data lines DLs may be connected to the first integrated circuit device COP1, and the others may be connected to the second integrated circuit device COP2.

Referring to FIG. 9, from among the data lines DL arranged in the y direction, the data lines DL in the odd rows may be connected to the first integrated circuit device COP1 and the data lines DL in the even rows may be connected to the second integrated circuit device COP2. The connection lines CL may include first portions extending in the second direction and second portions extending in a direction crossing the first direction. The second portions may extend obliquely to the second direction. An angle formed between the second direction and a second portion connected to a data line disposed close to the third area 3A is greater than that connected to a data line disposed away from the third area 3A.

Referring to FIG. 10, from among the data lines DL, the data lines DL arranged in the first area 1A may be connected to the first integrated circuit device COP1 and the data lines DL arranged in the second area 2A may be connected to the second integrated circuit device COP2. The number of the integrated circuit devices COP may be varied depending on a number of data lines, for example, the number of the integrated circuit devices COP may be from 1 to 4. As shown in FIGS. 9 and 10, the connection line CL may extend across the display area DA to the third area 3A. However, the disclosure is not limited thereto. As shown in FIG. 11, the connection lines CL may not be arranged in the display area DA and may bypass the display area DA through the peripheral area PA to extend to the third area 3A. In this case, the connection line CL may be arranged on a layer different from or identical to the data line DL.

The display panel 10 according to the present embodiment may operate advantageously for high-frequency driving by arranging the data lines DL to extend in the x direction corresponding to the short side of the display area DA and arranging the scan lines SL to extend in the y direction corresponding to the long side of the display area DA.

FIG. 12 is a table showing measurements of one horizontal scanning period 1H and data load time at 240 Hz of embodiments and comparative examples of the disclosure.

Comparative Example 1 is a landscape-type display panel having a long side in the x direction and a short side in the y direction, and the data line extends in the y direction, which is the short side direction, and the scan line extends in the x direction, which is the long side direction. The size of the display panel is about 383 mm×215 mm. Because the number of scan lines arranged in the Comparative Example 1 is small, the one horizontal scanning period 1H is 1.82 us and the data load time is 0.87 μs, which are appropriate values for high frequency driving.

Comparative Example 2 is a portrait-type display panel having a short side in the x direction and a long side in the y direction, and the data line extends in the y direction, which is the long side direction, and the scan line extends in the x direction, which is the short side direction. The size of the display panel is about 215 mm×383 mm. Because the number of scan lines in the Comparative Example 2 increases, the one horizontal scanning period 1H may have a value of 1.37 μs, which is less than that of the Comparative Example 1, and because the length of the data line is long, the data load time may be 1.36 μs, which is greater than that of the Comparative Example 1. It may be confirmed that the Comparative Example 2 does not have appropriate specifications suitable for high frequency driving.

Embodiment is a display panel according to embodiments of the inventive concept, and is a portrait-type display panel having a short side in the x direction and a long side in the y direction as shown in the Comparative Example 2, wherein the data line extends in the x direction, which is a short side direction, and the scan line extends in the y direction, which is a long side direction. The size of the display panel is about 215 mm×383 mm.

Because the number of scan lines arranged in the Embodiment is small, one horizontal scanning period 1H is 1.82 μs and the data load time is 1.32 μs being less than that of the Comparative Example 2, both values of which are appropriate for high frequency driving.

As described above, one or more embodiments are described with reference to the embodiments shown in the drawings, which are merely examples, and those skilled in the art will understand that various modifications and equivalent other embodiments are possible therefrom. Therefore, the true technical protection scope of the present disclosure should be determined by the technical spirit of the appended claims.

According to the foldable display panel and the display apparatus of the disclosure, by optimally arranging the data lines, the scan lines, and the connection lines, a display panel and a display apparatus capable of high frequency driving with high reliability may be provided.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display panel comprising:
   a substrate comprising a first area and a second area disposed on respective sides of a folding line extending in a first direction and a third area protruding from the second area;
   display devices arranged in a display area which is disposed on the first area and the second area;
   pixel circuits arranged in the display area and each comprising a thin-film transistor;
   data lines connected to the pixel circuits, respectively, and extending in the first direction;
   scan lines extending in a second direction crossing the first direction; and
   connection lines arranged on a layer different from the data lines, connecting the data lines to conductive layers arranged in the third area, respectively, and extending from the display area disposed on the first area and the second area to the third area.

2. The display panel of claim 1, wherein the third area protrudes from the second area in the first direction, and
   wherein a width of the third area in the second direction is less than or equal to a width of the second area in the second direction.

3. The display panel of claim 1, further comprising:
   a first scan driver arranged in a peripheral area of the first area; and
   a second scan driver arranged in a peripheral area of the second area,
   wherein the first scan driver and the second scan driver are symmetrically arranged with respect to the folding line.

4. The display panel of claim 1, wherein each of the connection lines comprises a first portion extending in the first direction and a second portion extending in the second direction.

5. The display panel of claim 1, wherein an interval between adjacent connection lines is less than an interval between adjacent data lines.

6. The display panel of claim 1, wherein the connection lines are arranged between the substrate and a semiconductor layer of the thin-film transistor.

7. The display panel of claim 1, further comprising a first planarization layer and a second planarization layer arranged between the display devices and the thin-film transistor, wherein the data lines are arranged between the first planarization layer and the second planarization layer.

8. The display panel of claim 1, further comprising a first planarization layer, a second planarization layer, and a third planarization layer arranged between the display devices and the thin-film transistor, wherein the data lines are arranged between the first planarization layer and the second planarization layer, and wherein the connection lines are arranged between the second planarization layer and the third planarization layer.

9. The display panel of claim 1, wherein each of the conductive layers is a terminal to which an integrated circuit device is connected.

10. The display panel of claim 1, wherein the connection lines are inclined at certain angles with respect to the first direction in the display area disposed on the first area and the second area.

11. A display apparatus comprising:

a display panel; and a housing in which the display panel is accommodated, wherein the display panel comprises:

a substrate comprising a first area and a second area disposed on respective sides of a folding line extending in a first direction and a third area protruding from the second area in the first direction;

display devices arranged in a display area which is disposed on the first area and the second area;

pixel circuits arranged in the display area and each comprising a thin-film transistor;

data lines connected to the pixel circuits, respectively, and extending in the first direction;

scan lines extending in a second direction crossing the first direction; and connection lines arranged on a layer different from the data lines, connecting the data lines to conductive layers arranged in the third area, respectively, and extending from the display area disposed on the first area and the second area to the third area.

12. The display apparatus of claim 11, wherein at least a portion of the third area is bent, and wherein at least a portion of the third area is arranged in a lower portion of the second area to overlap the second area.

13. The display apparatus of claim 11, further comprising an integrated circuit device connected to the conductive layers.

14. The display apparatus of claim 11, wherein each of the connection lines comprises a first portion extending in the first direction and a second portion extending in the second direction.

15. The display apparatus of claim 11, wherein an interval between adjacent connection lines is less than an interval between adjacent data lines.

16. The display apparatus of claim 11, wherein the connection lines are disposed between the substrate and a semiconductor layer of the thin-film transistor.

17. The display apparatus of claim 11, further comprising a first planarization layer and a second planarization layer arranged between the display devices and the thin-film transistor, wherein the data lines are arranged between the first planarization layer and the second planarization layer.

18. The display apparatus of claim 11, further comprising a first planarization layer, a second planarization layer, and a third planarization layer arranged between the display devices and the thin-film transistor, wherein the data lines are disposed between the first planarization layer and the second planarization layer, and wherein the connection lines are disposed between the second planarization layer and the third planarization layer.

19. The display apparatus of claim 11, wherein the connection lines are inclined at certain angles with respect to the first direction in the display area.

20. The display apparatus of claim 11, wherein the connection lines are respectively connected to the data lines through contact holes which are disposed on a line extending along the second direction.

21. A display panel comprising:

a substrate including a first area and a second area disposed on respective sides of a folding line extending in a first direction and a third area protruding from the second area;

data lines extending in the first direction;

scan lines extending in a second direction crossing the first direction; and connection lines arranged on a layer different from the data lines, connecting the data lines to conductive layers arranged in the third area, respectively, and extending from a display area disposed on the first area and the second area to the third area.

22. The display apparatus of claim 21, wherein the third area protrudes from the second area along the first direction.

23. The display apparatus of claim 22, wherein the connection lines include first portions extending in the first direction and second portions extending in the second direction crossing the first direction.

24. The display apparatus of claim 23, wherein the second direction is perpendicular to the first direction.

25. The display apparatus of claim 24, wherein a length of a first portion disposed close to the first area is shorter than that disposed away from the first area.

26. The display apparatus of claim 21, wherein the third area protrudes from the second area along the second direction.

27. The display apparatus of claim 26, wherein the connection lines include first portions extending in the second direction and second portions extending in a direction crossing the first direction.

28. The display apparatus of claim 27, wherein the second portions extend obliquely to the second direction.

29. The display apparatus of claim 28, wherein an angle formed between the second direction and a second portion connected to a data line disposed close to the third area is greater than that connected to a data line disposed away from the third area.

* * * * *